(12) United States Patent
Rogren

(10) Patent No.: US 8,749,035 B2
(45) Date of Patent: Jun. 10, 2014

(54) LEAD CARRIER WITH MULTI-MATERIAL PRINT FORMED PACKAGE COMPONENTS

(75) Inventor: Philip E. Rogren, Half Moon Bay, CA (US)

(73) Assignee: EoPlex Limited, Hong Kong (CN)

( * ) Notice: Subject to any disclaimer, the term of this patent is extended or adjusted under 35 U.S.C. 154(b) by 0 days.

(21) Appl. No.: 13/571,687

(22) Filed: Aug. 10, 2012

(65) Prior Publication Data

US 2013/0037927 A1 Feb. 14, 2013

Related U.S. Application Data

(60) Provisional application No. 61/522,410, filed on Aug. 11, 2011.

(51) Int. Cl.
*H01L 23/495* (2006.01)

(52) U.S. Cl.
USPC ..................... 257/676; 257/E23.03

(58) Field of Classification Search
USPC ................. 257/676, 659, 696, 697, 700, 723, 257/E21.518, 684, E23.006, E23.176, 257/E23.181, E23.192, E25.016
See application file for complete search history.

(56) References Cited

U.S. PATENT DOCUMENTS

| | | | |
|---|---|---|---|
| 6,967,396 B1 * | 11/2005 | Shibata | 257/684 |
| 2008/0224290 A1 * | 9/2008 | Abbott | 257/676 |
| 2012/0211889 A1 * | 8/2012 | Edwards et al. | 257/746 |

* cited by examiner

*Primary Examiner* — Yu-Hsi D Sun
*Assistant Examiner* — Christina Sylvia
(74) *Attorney, Agent, or Firm* — Heisler & Associates

(57) ABSTRACT

A lead carrier provides support for a semiconductor device during manufacture. The lead carrier includes a temporary support member with multiple package sites. Each site includes a die attach pad surrounded by terminal pads. The pads are formed of multiple materials including a lower layer and a body portion. An upper layer can also be provided over the body portion. A chip is mounted upon the die pad and wire bonds extend from the chip to the terminal pads. These parts are all encapsulated within a mold compound. The body portion is preferably formed by providing a matrix of metal powder and a suspension medium at locations where the pads are to be located. Heat is applied to disperse the suspension medium and sinter the metal powder to form the body portion. After encapsulation the temporary support member can be peeled away and the package sites isolated from each other.

16 Claims, 8 Drawing Sheets

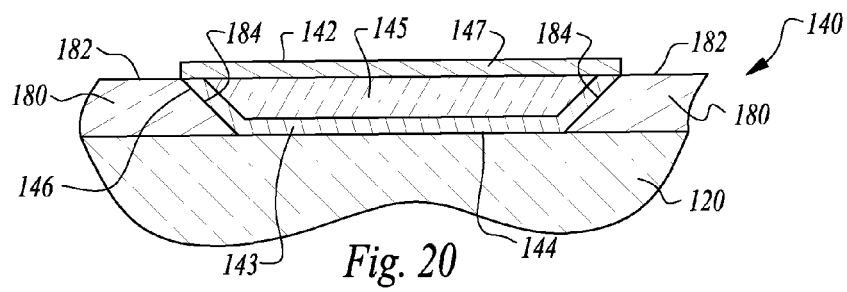
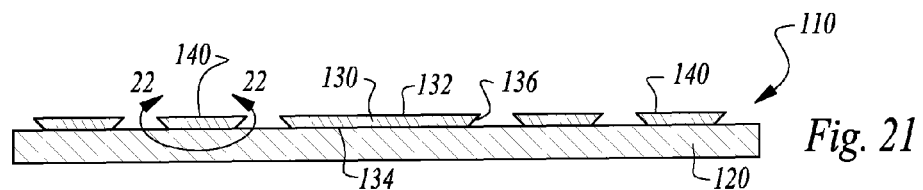
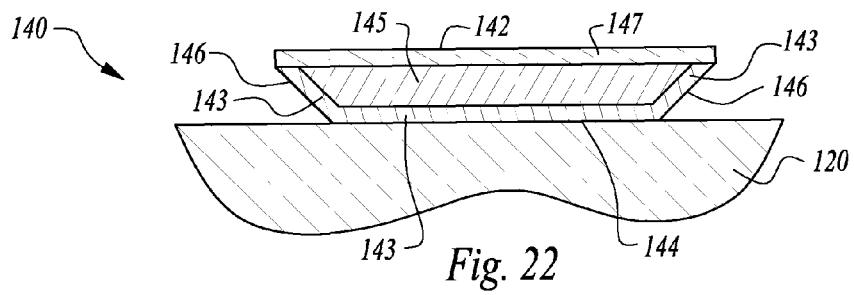
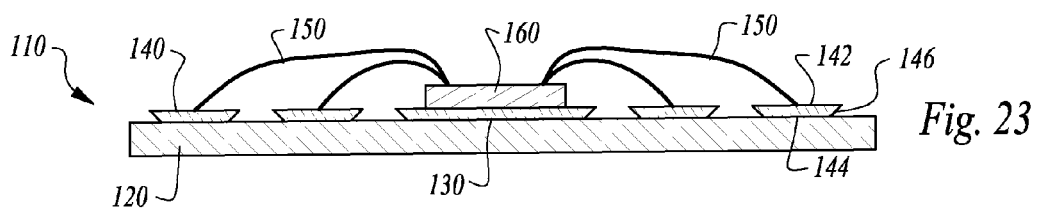
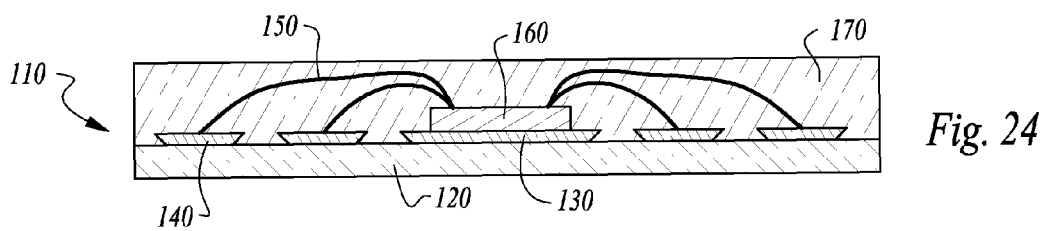
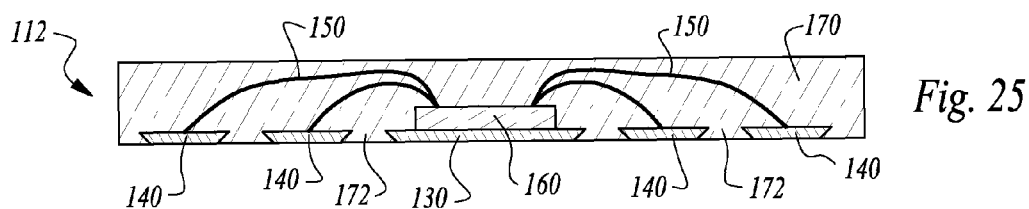

LEAD CARRIER WITH MULTI-MATERIAL PRINT FORMED PACKAGE COMPONENTS

CROSS-REFERENCE TO RELATED APPLICATIONS

This application claims benefit under Title 35, United States Code §119(e) of U.S. Provisional Application No. 61/522,410, filed on Aug. 11, 2011.

FIELD OF THE INVENTION

The following invention relates to lead carrier packages for use with an integrated circuit chip for effective interconnection of the integrated circuit chip in an electrical system. More particularly, this invention relates to lead frames and other lead carriers which are manufactured as an array of multiple package sites within a common assembly before and during combination with the integrated circuit, attachment of wire bonds and encapsulation within non-conductive material, before isolation into individual packages for use upon an electronics system board, such as a printed circuit board.

BACKGROUND OF THE INVENTION

The demand for smaller and more capable, portable electronic systems, combined with the increased level of integration in today's semiconductors, is driving a need for smaller semiconductor packages with greater numbers of input/output terminals. At the same time, there is relentless pressure to reduce the cost of all the components of consumer electronic systems. The quad flat no lead ("QFN") semiconductor package family is among the smallest and most cost effective of all semiconductor packaging types, but when fabricated with conventional techniques and materials, has significant limitations. For instance, with QFN technology the number of I/O terminals and the electrical performance that the technology can support is limited.

QFN packages P (FIGS. 5-7) are conventionally assembled on an area array lead frame 1 (FIGS. 1 and 2) etched from a copper sheet. A lead frame 1 can contain from tens to thousands of package sites, each comprised of a die attach pad 2 (FIGS. 1, 2 and 5-7) surrounded by one or more rows of wire bond pads 4 (FIGS. 2 and 5-7). All of these package P components are attached to a common frame 1 by pieces of copper to maintain the position of the package P components relative to the rest of the lead frame 1 and to provide an electrical connection to all of the components, to facilitate plating of the bonding and soldering surfaces.

These connected structures, commonly known as tie bars 3 (FIGS. 1, 2 and 5-7) short all of the components of the lead frame 1 together. Therefore, these tie bars 3 must be designed such that they can all be disconnected from the common shorting structure 6 (FIGS. 1 and 2) surrounding each package P site during singulation of the individual packages P from the lead frame 1, leaving each die attach pad 2 and wire bond pad 4 electrically isolated. Typically, the design to facilitate severing the electrical connection of the tie bars 3 to the lead frame 1 involves connecting the tie bars 3 to the copper shorting structure 6 (FIGS. 1 and 2) surrounding each package P site, just outside of the final package P footprint. This shorting structure 6 is sawn away (along line X of FIG. 2) during the singulation process, leaving the tie bars 3 exposed at the edge of the package P.

The QFN lead frame 1 provides the parts of the package P that facilitate fixing the semiconductor die, such as an integrated circuit chip 7 (FIGS. 5-7) within the package P and the terminals that can be connected to the integrated circuit 7 through wire bonds 8 (FIGS. 5 and 6). The terminals, in the form of the wire bond pads 4, also provide a means of connecting to the electronic system board (such as a printed circuit board) through a solder joint 5 (FIGS. 5-7) on the surface opposite that of the wire bond 8 surface.

The requirement that all of the package P components be connected to the lead frame 1 by a metal structure, severely limits the number of leads that can be implemented in any given package P outline. For instance, wire bond pads 4 can be provided in multiple rows surrounding the die attach pads 2 with each row being a different distance away from the die attach pads 2. For any wire bond pads 4 inside the outermost row of wire bond pads 4, the tie bar 3 connecting structures must be routed between the pads 4 of the outer row, so that such tie bars 3 can extend to the common sorting structure 6 outboard of the package P isolation (along line X). The minimum scale of these tie bars 3 is such that only one can be routed between two adjacent pads 4. Thus, only two rows of pads 4 may be implemented in a standard QFN lead frame 1. Because of the current relationship between die size and lead count, standard QFN packages are limited to around one hundred terminals, with a majority of packages P having no more than about sixty terminals. This limitation rules out the use of QFN packaging by many types of dies that would otherwise benefit from the smaller size and lower cost of QFN technology.

While conventional QFN technology is very cost effective, there are still opportunities to further reduce the cost. After the integrated circuit chips 7 are attached and connected to the external lead wire bond pads 4 with wire bonds 8, the assembled lead frame 1 of multiple packages P is completely encapsulated with epoxy mold compound 9 (FIGS. 6 and 7), such as in a transfer molding process. Because the lead frame 1 is largely open front to back, a layer of high temperature tape T is applied to the back of the lead frame 1, prior to the assembly process, to define the back plane of each package P during molding. Because this tape T must withstand the high temperature bonding and the molding process, without adverse effect from the hot processes, the tape is relatively expensive. The process of applying the tape T, removing the tape T and removing adhesive residues, can add significant cost to processing each lead frame 1.

The most common method of singulation of the individual packages P from the lead frame 1 is by sawing (along line X of FIG. 2). Because the saw must remove all of the shorting structures 6 just outside the package P outline, in addition to cutting the epoxy mold compound 9, the process is substantially slower and blade life considerably shorter, as if only mold compound 9 is cut. Because the shorting structures 6 are not removed until the singulation process, this means that the dies cannot be tested until after singulation. Handling thousands of tiny packages P, and assuring each is presented to the tester in the correct orientation is much more expensive than being able to test the whole strip with each passage P in a known location.

A lead frame 1 based process, known as punch singulation, to some extent addresses the problem associated with saw singulation and allows testing in the lead frame 1 strip, but substantially increases cost by cutting utilization of the lead frame 1 to less than fifty percent of that of a saw singulated lead frame 1. Punch singulation also imposes a requirement for dedicated mold tooling for every basic lead frame design. Standard lead frames 1 designed for saw singulation use a single mold cap for all lead frames 1 of the same dimensions.

In both saw singulated and punch singulated packages P, the tie bars 3 are left in the completed packages P and represent both capacitive and inductive parasitic elements that cannot be removed. These now superfluous pieces of metal significantly impact the performance of the completed package P, precluding the use of QFN packages P for many high performance integrated circuit chips 7 and applications. Furthermore, the cost of this potentially rather valuable superfluous metal can be substantial and is wasted by the QFN process.

Several concepts have been advanced for QFN type substrates that eliminate the limitations of etched lead frames. Among those is a process that deposits the array of package components on a sacrificial carrier by electroplating. The carrier is first patterned with plating resist and the carrier, usually stainless steel, is slightly etched to enhance adhesion. The strip is then plated with gold and palladium to create an adhesion/barrier layer, then plated with Ni to around sixty microns thick. The top of the Ni bump is finished with a layer of electroplated Ag to facilitate wire bonding. After the strip is assembled and molded, the carrier strip is peeled away to leave a sheet of packaged dies that can be tested in the sheet and singulated at higher rates and yields than with conventional lead frames. This electroplated approach eliminates all of the issues associated with connective metal structures within the package and allows for very fine features. The plating process, however, results in strips that are very expensive compared to standard etched lead frames. This approach is described in U.S. Pat. No. 7,187,072 by Fukutomi, et al.

Another approach is a modification of the etched lead frame process wherein the front side pattern is etched to about half the thickness of the lead frame, and the backside of the lead frame strip is left intact, until after the molding process is complete. Once molding is complete, the backside pattern is printed and the lead frame etched to remove all of the metal except for the backside portion of the wire bond pads and die paddle. This double etch process eliminates all of the issues associated with connective metal structures within the package. The cost of the double etched lead frame is less than the electroplated version, but still more expensive than standard etched lead frames, and the etching and plating processes are environmentally undesirable.

One failure mode for a lead frame packaged integrated circuit is for the wire bond pads 4 to become disconnected from wire bonds 8 coupled thereto, especially when a shock load is experienced by the package (such as when an electronic device incorporating the package therein is dropped and hits a hard surface). The wire bond pad 4 can remain mounted to a printed circuit board or other electronic system board while separating slightly from surrounding epoxy mold compound, allowing the wire bond 8 to be severed from the wire bond pad 4. Accordingly, a further need exists for a lead carrier package which better holds the wire bond pads 4 within the entire package, especially when shock loads are experienced.

Another lead carrier known in the art and developed by Eoplex, Inc. of Redwood City, Calif. is known as a lead carrier with print-formed package components and is the subject of U.S. patent application Ser. No. 13/135,210, incorporated by reference herein in its entirety. This lead carrier with print-formed components is provided with an array of separate package sites in the form of a multi-package lead carrier (see for example FIGS. 3 and 4 for a general depiction of one form of this lead carrier). A sintered material, typically beginning as silver powder, is placed upon a temporary layer formed of high temperature resistant material, such as stainless steel. The stainless steel or other material forming the temporary layer supports the sintered material while it is heated to a sintering temperature.

The sintered material is located upon the temporary layer in separate structures preferably electrically isolated from each other (other than through the temporary layer) in the form of die attach pads and terminal pads. One or more terminal pads surround each die attach pad. Each die attach pad is configured to have an integrated circuit or other semiconductor device supported thereon. Wire bonds can be routed from the integrated circuit upon the die attach pad to the separate terminal pads surrounding each die attach pad (see for example FIG. 8). Mold compound can then be applied which encapsulates the die attach pads, integrated circuits, terminal pads and wire bonds (see for example FIGS. 9 and 10). Only surface mount joints defining under portions of the die attach pad and terminal pads remain unencapsulated (FIG. 10) because they are adjacent the temporary layer.

Once the mold compound of the lead carrier has hardened, the temporary layer can be peeled away from the remaining portions of the lead carrier, leaving a plurality of package sites with individual die attach pads and associated integrated circuits, terminal pads and wire bonds all embedded within a common mold compound. The individual package sites can then be cut from each other by cutting along boundaries between the package sites and surface mounted through the surface mount joints to an electronics system board or other support.

Because the package sites of the lead carrier and individual pads within the package sites are each electrically isolated from each other, other than through the temporary layer, these individual pads can be tested for electrical continuity while on the temporary layer. After removal of the temporary layer, but before singulation into separate packages, a variety of electrical performance characteristics can be tested. Furthermore, such packages could be tested after isolation from adjacent packages on the lead carrier utilizing known testing equipment utilized with QFN packages or other testing equipment.

Additionally, each pad of the lead carrier, including the die attach pads and the terminal pads, preferably has edges around peripheries thereof which are configured to mechanically engage with the mold compound somewhat. In particular, these edges can taper in an overhanging fashion, or be stepped in an overhanging fashion, or otherwise be configured so that at least a portion of each edge spaced from a bottom thereof extends further laterally than portions of each edge closer to a bottom portion of each edge. Thus, the mold compound, once hardened, locks the pads securely into the mold compound. In this way, the pads resist detachment from the wire bonds or otherwise becoming detached from the mold compound, especially when the temporary layer is peeled away, and keep the entire package as a single unitary package.

SUMMARY OF THE INVENTION

With this invention a lead carrier is provided with an array of separate package sites in the form of a multi-package lead carrier. Each package site includes at least one die attach pad and at least one terminal pad, but typically includes multiple rows of multiple terminal pads surrounding each die attach pad. The pads are affixed to a temporary support layer formed of a material compatible with the requirements of the semiconductor assembly processes, such as steel or a steel alloy or stainless steel.

The die attach pads and terminal pads are fixed to the temporary support layer by first providing a lower layer of highly conductive metal that is compatible with conventional processes for semiconductor die attach, gold or copper thermosonic wire bonding and SMT (surface mount technology)

soldering. Further, a body portion of the die attach pads and the terminal pads is placed above the lower layer, preferably as a suspension comprised of metal powder and a suspension medium which are heated after placement to sufficiently high temperature to decompose and disperse the suspension medium and cause the metal powder to sinter into a high density mass forming the body portion. The body portion retains a predictable approximation of the shape that the powder and suspension medium had when placed on the temporary support member.

The adhesion of the metal forming the die attach pads and the terminal pads relative to the temporary support member is carefully controlled by selecting the composition for the material forming the lower layer to provide adequate adhesion to prevent damage or detachment of the pads during a semiconductor assembly process. Additionally, sufficiently low adhesion is desired to allow the temporary support layer to be peeled away after the plurality of package sites are assembled with an integrated circuit or other semiconductor mounted upon the die attach pad and wire bonds have joined this semiconductor to the terminal pads and encapsulation of the semiconductor, wire bond and pads has occurred within an epoxy mold compound. The resulting package sites are formed of the resulting pads, integrated circuit and wires, undamaged and embedded within the epoxy mold compound, and with lower surfaces of the die attach pads and terminal pads exposed such as for testing before or after singulation of the package sites from each other and for mounting, such as using SMT procedures.

An optional third layer is preferably provided above the body portion. This third layer is formed of a material to which gold or copper wire can be readily thermosonic wire bonded. This third layer can optionally also be provided on an upper surface above the body portion of the die attach pads as well. The body portions of the die attach pad and terminal pad are preferably ten to one hundred times thicker than the thicknesses of the lower layer and any upper layer of the pads. In this way, pads are provided which are multi-material in nature with a lower layer formed of a first material optimized for attributes such as resistance to corrosion, being highly solderable to be compatible with surface mount technology (SMT) manufacturing techniques, and exhibiting the right amount of adhesion qualities relative the temporary support layer.

The second material forming the body portion of each pad need only have a minimum requisite electrical conductivity and mechanical strength, otherwise be sufficiently compatible with the lower layer, but can generally be selected from a material which is less rare than the material forming the lower layer, such that cost is reduced, especially when factoring in the significantly greater thickness of the body portion relative to the lower layer. Similarly, any upper layer can be formed of a material which is optimized for characteristics such as being highly compatible with thermosonic welding of gold or copper wire. Examples for materials forming the lower layer or the upper layer include silver, gold, platinum, nickel, palladium, aluminum, tin and alloys of these metals. Representative materials for forming the body portion can include copper, nickel, iron and alloys of these metals.

When manufacturing the lead carrier including the multi-material pads, the temporary support member is typically initially provided with a temporary form material thereon. One methodology for such temporary form material placement can include providing a full layer of temporary form material and then placing a photo etch mask on this layer of temporary form material and exposing the temporary form material to photonic radiation to selectively remove portions of the temporary form material and leave positions between the temporary form material where the pads can be formed in a subsequent step. Preferably, edges of this temporary form material are tapered to provide the interlocking structure for the edges of the pads which can either be a somewhat continuous taper or a stepped shape, or otherwise have an interlocking form with later supplied encapsulating material.

In a next step, a thin layer of the lower layer material is applied to the temporary support layer. This lower layer is preferably applied at pad locations between remaining portions of the temporary form material and also on lateral surfaces of the temporary form material, but preferably not on top surfaces of the temporary form material. One method for providing this lower layer can be electroplating. Next, remaining portions of the pads are formed by placing the metal powder and suspension medium combination upon the temporary support member in a manner filling the positions between remaining portions of the temporary form material to provide the body portions of the pads. This material can be flowable if it is in the form of a paste and applied, such as using a silkscreening process, to fill these voids between the remaining temporary form material. The upper layer can optionally be provided by a further electroplating step to cover the body portions of terminal pads and/or die attach pads.

Heat is then applied to cause the decomposition/removal of the suspension medium and also to sinter the metal powder forming the body portion into a solid mass. This heat can simultaneously also remove the temporary form material. An integrated circuit or other semiconductor can then be surface mounted upon the die attach pad and wire bonds can be placed, such as through thermosonic wire bonding techniques, between the semiconductor and the terminal pads. Encapsulation of the entire package can then occur with an encapsulating non-electrically conductive epoxy compound.

Once this compound has hardened, the temporary support member can be peeled away from remaining portions of the lead carrier so that lower surfaces of the die attach pads are exposed, such as for testing of the various package sites within the lead carrier. Finally, singulation such as by cutting between the package sites can occur to provide completed packages. The exposed lower surfaces of the pads are formed by the lower layer and thus exhibit the low corrosion and high solderability characteristics associated with this first material from which the lower layer is formed. Thus, the package is readily mountable through SMT or other soldering techniques and can also be stored for long periods of time without corrosion degrading future mountability.

OBJECTS OF THE INVENTION

Accordingly, a primary object of the present invention is to provide a system for fabricating the electrical interconnect components of a semiconductor package that allows for the implementation of a simplified QFN process to more easily produce QFN packaged semiconductor dies.

Another object of the present invention is to provide a QFN fabrication process which is lower cost to put into practice.

Another object of the present invention is to provide a system and method for forming the electrical interconnect components of a semiconductor package arrayed on a sacrificial carrier that can be peeled away or otherwise separated after molding, to yield a continuous strip of multiple semiconductor packages with pads with no electrical connection between any two pads, to facilitate testing at various different stages of manufacture and avoidance of material waste.

Another object of the present invention is to provide the electrical interconnect components of a semiconductor package in a manner that enables higher electrical performance while utilizing a minimum amount of metal therein to facilitate electrical connection of a semiconductor die to the system board of an electronic system.

Another object of the present invention is to provide the electrical interconnect components of a semiconductor package that allow for the inclusion of more than two rows of input/output terminals and many times the number of input/output terminals than are practical with lead frame based QFN packages.

Another object of the present invention is to provide electrical interconnect components of a semiconductor package that allows greater design flexibility to incorporate features, such as multiple power and ground structures and multiple die attach pads, when compared to prior art lead frame based QFN packages.

Another object of the present invention is to provide a lead carrier with multiple integrated circuit mounting package sites thereon which can be manufactured in a low cost high quality manner.

Another object of the present invention is to provide a semiconductor package for electrical interconnection to adjacent components which is highly resistant to damage associated with shock loads thereto.

Another object of the present invention is to provide a lead carrier with multiple integrated circuit mounting package sites which exhibits high performance electrically by minimizing excess conducting portions therein.

Another object of the present invention is to provide a lead carrier which has package sites thereon which can be tested at multiple stages in the manufacturing process in a simple and automated fashion.

Another object of the present invention is to provide a semiconductor package manufacturing method which lends itself to high quality low cost mass production fabrication.

Other further objects of the present invention will become apparent from a careful reading of the included drawing figures, the claims and detailed description of the invention.

BRIEF DESCRIPTION OF THE DRAWINGS

FIG. 20 is a detail of a portion of that which is shown in FIG. 17, taken along lines 20-20 of FIG. 17.

FIG. 21 is a full sectional view of the alternative lead carrier of one embodiment of this invention after having followed the sequential steps of FIGS. 14-17 in the manufacturing process.

FIG. 22 is a detail of a portion of that which is shown in FIG. 21, taken along lines 22-22 of FIG. 21.

FIGS. 23-25 are full sectional sequential views further showing how the alternative lead carrier of FIG. 21 can have an integrated circuit chip, wire bond and mold compound added thereto, as well as temporary support member removal, to complete formation of semiconductor packages according to this invention.

DESCRIPTION OF THE PREFERRED EMBODIMENT

Figure 1:
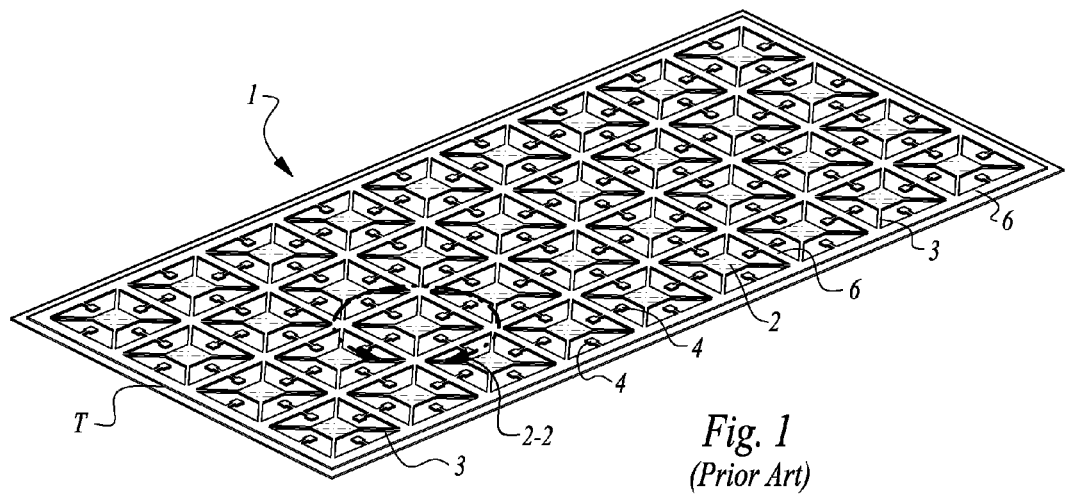
FIG. 1 is a perspective view of a QFN lead frame of a simplified variety and illustrating prior art lead frame technology.

Referring to the drawings, wherein like reference numerals represent like parts throughout the various drawing figures, reference numeral 110 (FIG. 21) is directed to a finished lead carrier of a preferred embodiment. This lead carrier 110 includes a temporary support member 120 thereon, and is also embodied in a final package assembly 112 (FIG. 25) after the temporary support member 120 has been removed.

The lead carrier 110 is in some respects similar to the lead carrier 10 (FIGS. 3, 4 and 8-10) described herein above and the subject of U.S. patent application Ser. No. 13/135,210, incorporated herein by reference in its entirety. This related lead carrier 10 (FIGS. 3 and 4) is configured to support a plurality of package sites 12 thereon upon a temporary support member 20 for manufacture of a plurality of packages 100 (FIGS. 9 and 10) including an integrated circuit chip 60 and to provide for a large number of inputs and outputs into the integrated circuit chip 60.

In essence, and with particular reference to FIGS. 3, 4, 8 and 9, basic details are described for the lead carrier 10 and package 100 to which the lead carrier 110 of this invention is related. The lead carrier 10 includes a temporary support member 20 of thin planar high temperature resistant material, such as stainless steel. A plurality of die attach pads 30 and terminal pads 40 are arrayed on the temporary support member 20 at package sites 12, with multiple terminal pads 40 surrounding each die attach pad 30.

Figure 8:
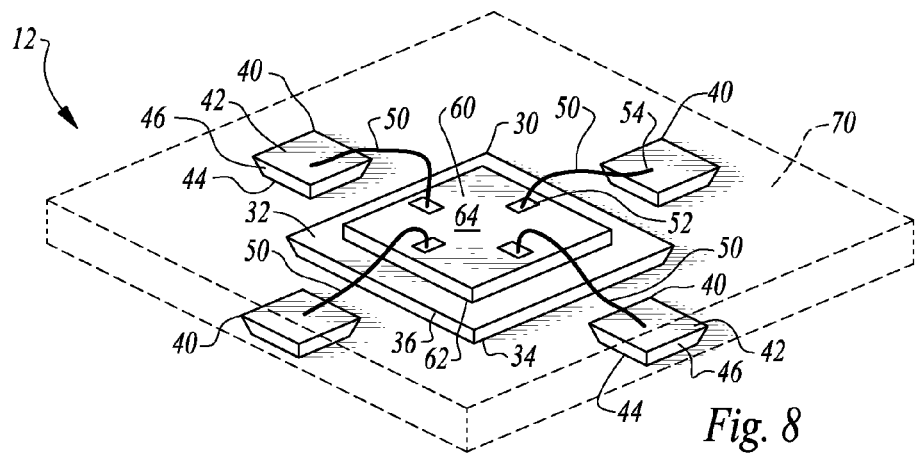
FIG. 8 is a perspective view of an individual package site on the lead carrier of this invention after placement of an integrated circuit chip and wire bonds, and illustrating in broken lines the position of mold compound.
Figure 9:
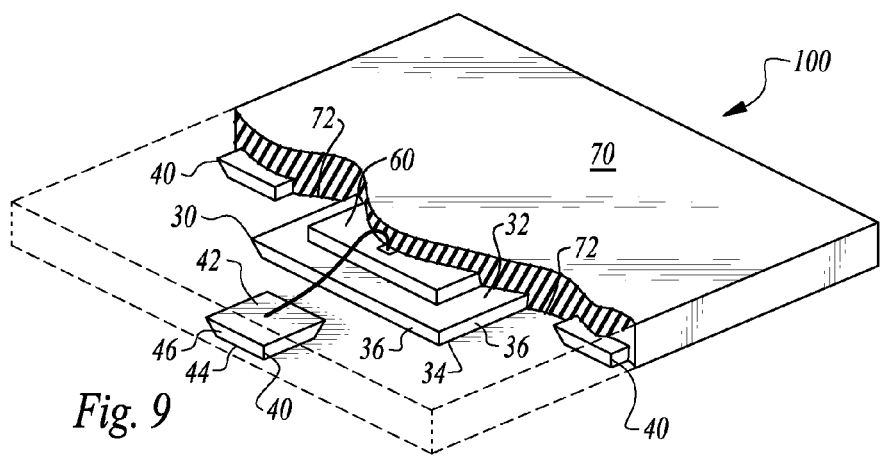
FIG. 9 is a perspective view similar to FIG. 8 but with the mold compound shown in place encapsulating conductive structures within the package, and with portions of the mold compound cut away to reveal interior details of the package.

An integrated circuit chip 60 is mounted upon the die attach pad 30 (FIGS. 8 and 9). Wire bonds 50 are joined between input output terminals on the chip 60 and the terminal pads 40. The entire package 100 including the die attach pad 30, terminal pad 40, wire bonds 50 and chip 60 are encapsulated within a mold compound 70 other than surface mount joint 90 portions (FIG. 10) defining an underside of the package 100. The mold compound 70 is typically applied to the lead carrier 10 to surround each of the package sites 12. Later isolation of each package 100 occurs by cutting of the mold compound 70 to provide multiple packages 100 from the original lead carrier 10.

Figure 2:
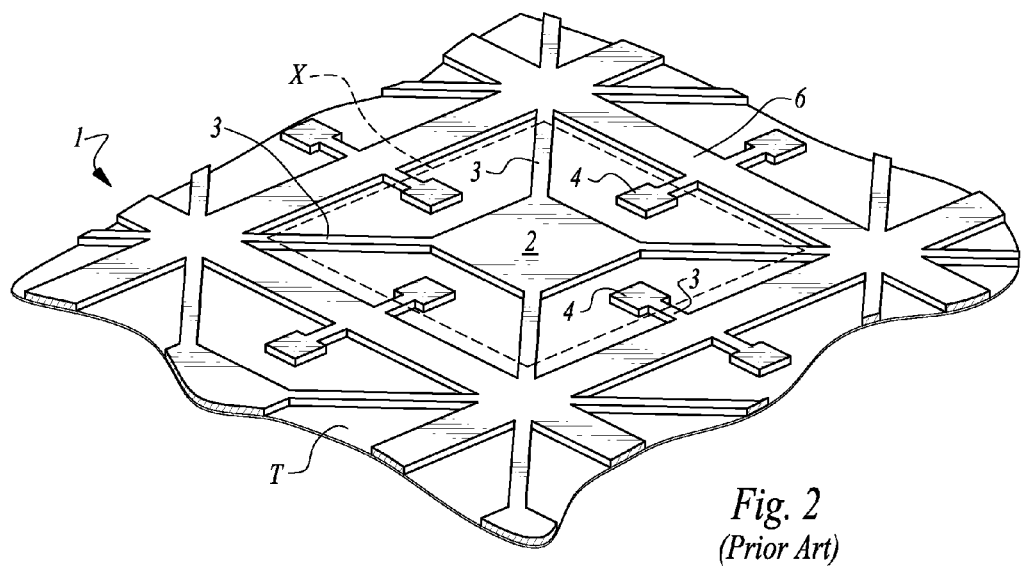
FIG. 2 is a perspective view of a detail of a portion of that which is shown in FIG. 1, along with dashed lines indicative of where cut lines are followed to separate individual package sites from the lead frame.
Figure 5:
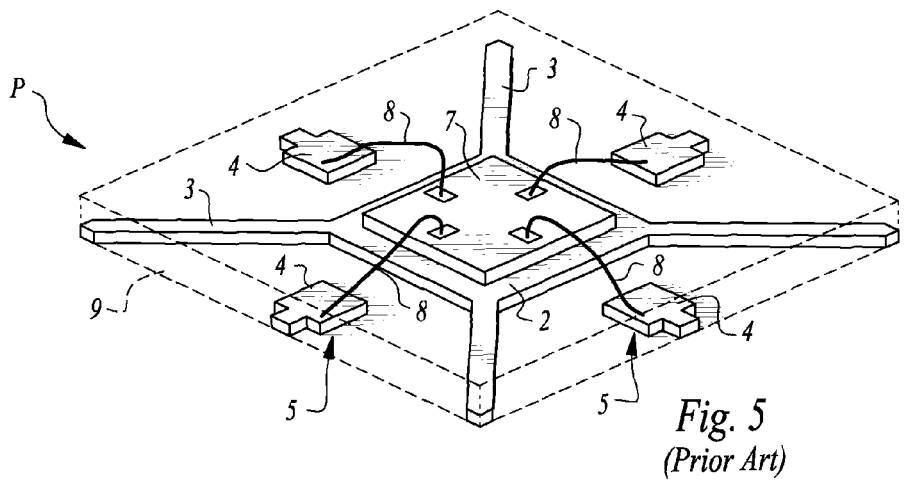
FIG. 5 is a perspective view of a prior art QFN package showing placement of an integrated circuit chip and wire bonds and illustrating in broken lines how encapsulation material is placed relative to other conductive structures within the package.
Figure 6:
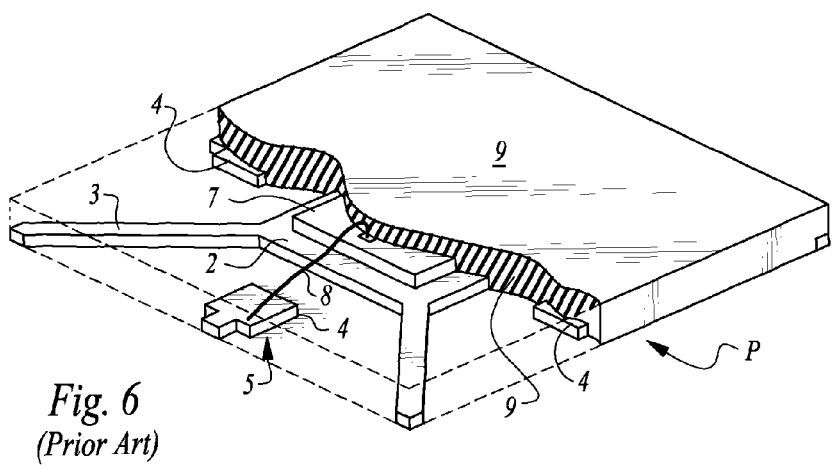
FIG. 6 is a perspective view similar to that which is shown in FIG. 5 but with the encapsulating mold compound in place, and with portions of the encapsulating mold compound cut away to reveal interior structures of the package.
Figure 7:
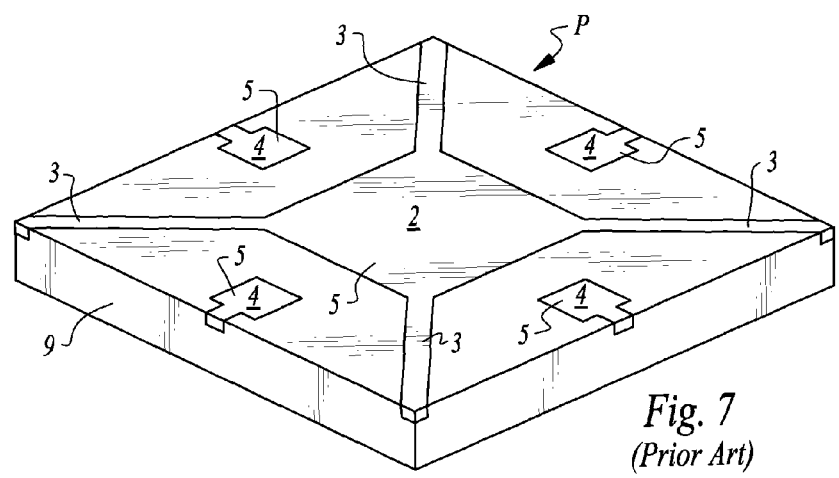
FIG. 7 is a perspective view similar to that which is shown in FIG. 6 but from below to illustrate solder joints available for surface mounting of the package upon an electronic system board or other interface within an electrical system.

With particular reference to FIGS. 1 and 2, details of a prior art lead frame 1 of a "quad flat no lead" (QFN) variety are described for comparison and contrast to the details of the lead carrier 10. In the embodiment shown, the QFN lead frame 1 is a planar structure of etched conductive material. This etched conductive material is etched into distinct die attach pads 2 and wire bond pads 4, each joined to a common shorting structure 6 through tie bars 3. This entire etched QFN lead frame 1 is mounted upon molding tape T so that epoxy mold compound 9 can be applied to the lead frame 1 and encapsulate the pads 2, 4 (FIGS. 5-7).

Before such encapsulation, an integration of the chip 7 is mounted upon the die attach pad 2. Wire bonds 8 are placed between the wire bond pads 4 and input/output terminals on the chip 7. The mold compound 9 can then entirely encapsulate the pads 2, 4 as well as the chip 7 and wire bonds 8. The mold compound is prevented from encapsulating an underside of the pads 2, 4 by the tape T. After the mold compound 9 has hardened, the tape T can be peeled away so that solder joints 5 (FIG. 7) are presented on an underside of the lead frame 1. Finally, the separate QFN packages P are isolated by cutting (along cut lines X of FIG. 2) to isolate each package P from the overall lead frame 1.

Importantly, it should be noted that portions of the tie bars 3 extending from the die attach pads 2 and the wire bond pads 4 remain within the package P. Some portions of these tie bars 3 actually extend out of an edge of the package P (FIGS. 6 and 7). Furthermore, the common shorting structure 6 (FIGS. 1 and 2) is not part of any package P. Thus, the common shorting structure 6 is typically wasted. Furthermore, remaining portions of the tie bars 3 within each package P do not provide any beneficial purpose and hence are also wasted within the package P. Such tie bar 3 remnants can also have a negative impact on the performance of the package P and the chip 7 within the package P. For instance, a portion of the tie bars 3 extending out of edges of the mold compound 9 of the package P presents an opportunity for undesirable shorting or for electromagnetic interference and "noise," such that certain electronics applications are not well served by prior art QFN packages P. Even when such prior art QFN packages P are suitable, waste associated with the common shorting structure 6 and tie bars 3 embedded within the package P is undesirable. Furthermore, the tape T is not reusable and is another wasted expense when utilizing known prior art QFN lead frame 1 and package P techniques (especially considering the non-recyclable and potentially hazardous nature of the tape T).

Figure 3:
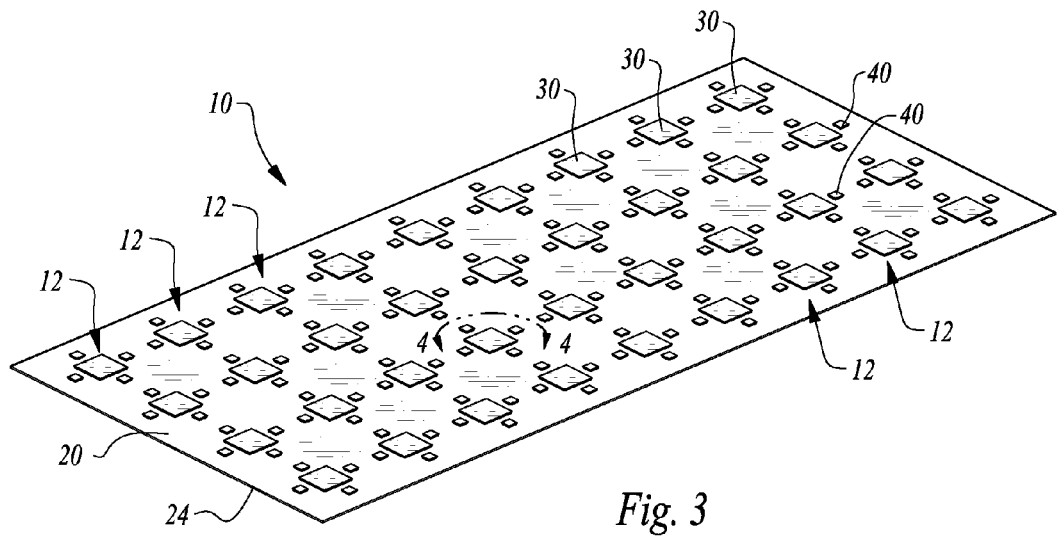
FIG. 3 is a perspective view of a lead carrier according to this invention with multiple separate package sites thereon and mounted upon a temporary support member.
Figure 4:
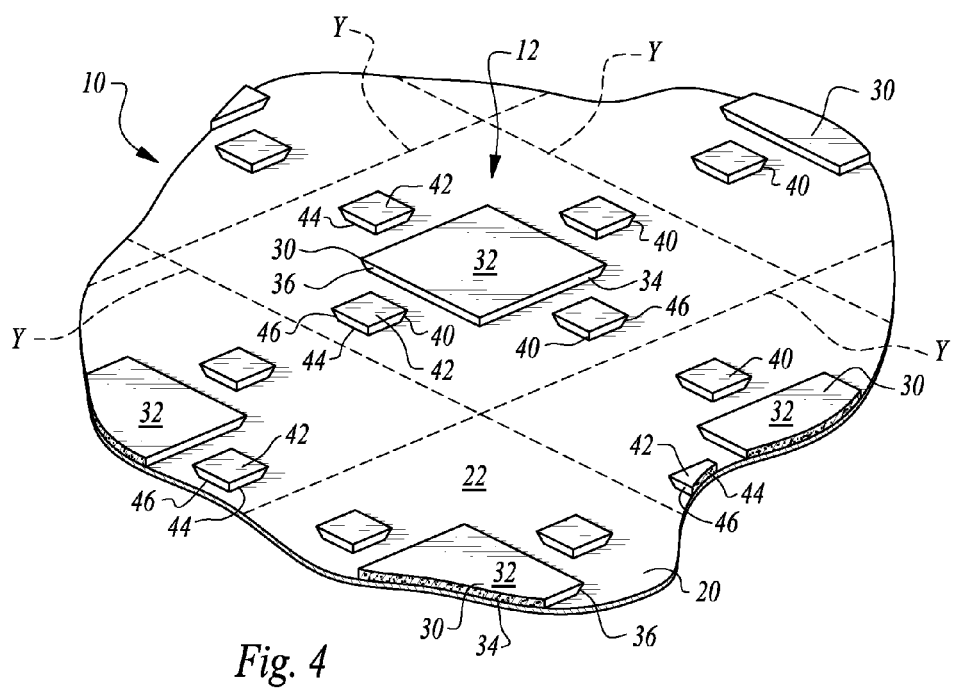
FIG. 4 is a perspective view of a detail of a portion of that which is shown in FIG. 3 and further illustrating details of each package site before mounting of an integrated circuit chip, attachment of wire bonds and encapsulation within mold compound.

Referring to FIGS. 3 and 4, specific details of the lead carrier 10 as well as the temporary support member 20 and pads 30, 40 are described, according to an exemplary embodiment. This exemplary embodiment is significantly simplified over a typical preferred embodiment in that each package site 12 only shows four terminal pads 40 surrounding each die attach pad 30. Typically, such terminal pads 40 would be presented in numbers of dozens or potentially even hundreds surrounding each die attach pad 30. It is also conceivable that as few as one terminal pad 40 would be provided adjacent each die attach pad 30. Such terminal pads 40 would typically be presented in multiple rows including an innermost row closest to the die attach pad 30, an outermost row of terminal pads 40 most distant from the die attach pad 30 and potentially multiple intermediate rows between an innermost row and an outermost row of terminal pads 40.

Figure 10:
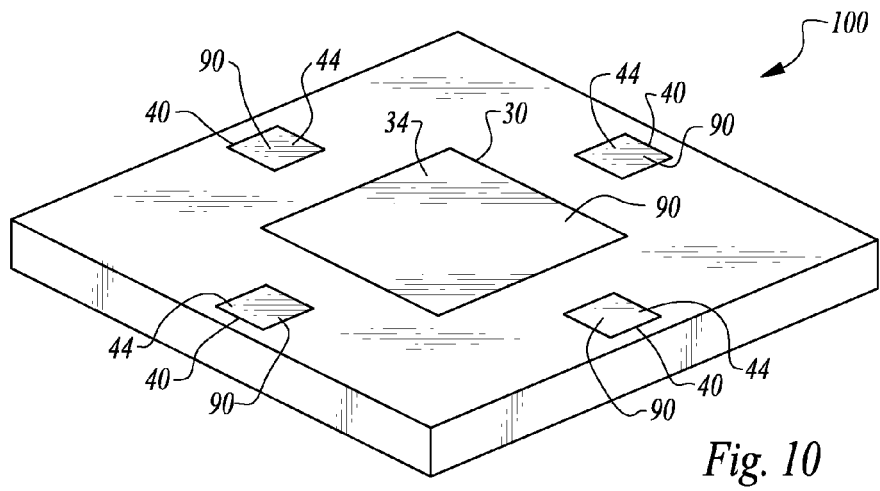
FIG. 10 is a perspective view from below of the package and illustrating surface mount joints of the package according to this invention.

The lead carrier 10 is a planar structure that is manufactured to include multiple package sites 12 and to support these package sites 12 during their manufacture and through testing and integration with integrated circuit chips 60 (or other semiconductor devices, such as diodes or transistors) and wire bonds 50 (FIGS. 8 and 9) to facilitate the ultimate production of multiple packages 100 (FIGS. 9 and 10). The lead carrier 10 includes a temporary support member 20. This temporary support 20 is a thin planar sheet of high temperature resistant material, most preferably stainless steel. This member 20 includes a top surface 22 upon which other portions of the lead carrier 10 are manufactured. An edge 24 of the temporary support member 20 defines a perimeter of the temporary support member 20. In this exemplary embodiment, this edge 24 is generally rectangular.

The temporary support member 20 is preferably sufficiently thin that it can flex somewhat and facilitate peeling removal of the temporary support member 20 from the lead carrier 10 (or vice versa) after full manufacture of packages 100 at the package sites 12 and lead carrier 10 (FIGS. 8-10).

The top surface 22 of the temporary support member 20 supports a plurality of package sites 12 thereon with each package site 12 including at least one die attach pad 30 and at least one terminal pad 40 adjacent each die attach pad 30. Cut lines Y generally define boundaries of each package site 12 (FIG. 4).

The die attach pads 30 and terminal pads 40 exhibit a different geometry and location, but are preferably formed of similar material. In particular, these pads 30, 40 are preferably formed of at least two sintered materials. According to a preferred embodiment, these pads 30, 40 begin as powders of electrically conductive materials, preferably copper and silver, mixed with a suspension component. This suspension component generally acts to give the powders a consistency of pastes or other flowable characteristics so that the powders can best be handled and maneuvered to exhibit the desired geometry for the pads 30, 40.

A mixture of this suspension component and the copper and silver powders or other electrically conductive powders are heated to a sintering temperature for the metal powder. The suspension component boils into a gas and is evacuated from the lead frame 10. The metal powders are sintered into a unitary mass having the shape desired for the die attach pads 30 and terminal pads 40.

The temporary support member 20 is configured to have thermal characteristics such that it maintains its flexibility and desired degree of strength and other properties up to this sintering temperature for the electrically conductive materials forming the pads 30, 40. Typically this sintering temperature is approaching the melting point for the metal powder that is sintered into the pads 30, 40.

With particular reference to FIGS. 8-10, details of each package 100 after further manufacture upon the lead carrier 10 at the various package sites 12 are described, according to one exemplary embodiment. An integrated circuit chip 60 is mounted upon the die attach pad 30 typically with a lower side of the integrated circuit chip 60 electrically coupled to the die attach pad 30. Such electric coupling can be common to "ground" for the chip 60 or common to some other reference for the chip 60, or can have some other electrical state within an overall electrical system in which the package 100 is utilized. The chip 60 includes a base 62 defining a lower portion thereof in contact with the top side 32 of the die attach pad 30. An upper surface 64 of the chip 60 is provided opposite the base 62. This upper surface 64 has a plurality of input output junctions which can be terminated to one end of a wire bond 50 (FIGS. 8 and 9).

One wire bond 50 is preferably terminated between each input output junction on the chip 60 and a surrounding terminal pad 40. Thus, each wire bond 50 has a chip end opposite a terminal end. Using known wire bond 50 terminating techniques, such as those used with QFN lead frames, these wire bonds 50 are coupled between the chip 60 and the terminal pads 40.

To complete the package 100 forming process, mold compound 70 is flowed over the lead carrier 10 and allowed to harden in a manner completely encapsulating each of the die attach pads 30, terminal pads 40, wire bonds 50 and integrated circuit chips 60. This mold compound 70 can mold against the top surface 22 of the temporary support member 20. Thus, the surface mount joints 90 of each pad 30, 40 remain exposed after removal of the temporary support member 20 (FIG. 10). The mold compound 70 is typically of a variety which is a fluid form at a first temperature but which can harden when adjusted to a second temperature.

The mold compound 70 is formed of a substantially non-conductive material such that the pads 30, 40 are electrically isolated from each other. The mold compound 70 flows between the pads 30, 40 to provide interlocks which tend to hold the pads 30, 40 within the overall package 100 and together with the mold compound 70. Such interlocks keep the terminal pads 40 from becoming detached from the wire bonds 50. Such detachment propensity is first resisted when the temporary support member 20 is removed from the lead carrier 10, and again beneficially is resisted when the package 100 is in use and might experience shock loads that might otherwise detach the terminal pads 40 from the package 100. These interlocks can have a variety of different shapes as defined above associated with the edges of the pads 30, 40.

After hardening of the mold compound 70, the package 100 is provided in an array on the lead carrier 10 with each package 100 including a top opposite a bottom and with perimeter sides. Beneficially, the perimeter sides are not required to have any electrically conductive material extending therefrom, in contrast to prior art QFN packages P (FIGS. 6 and 7), which must.

Figure 11:
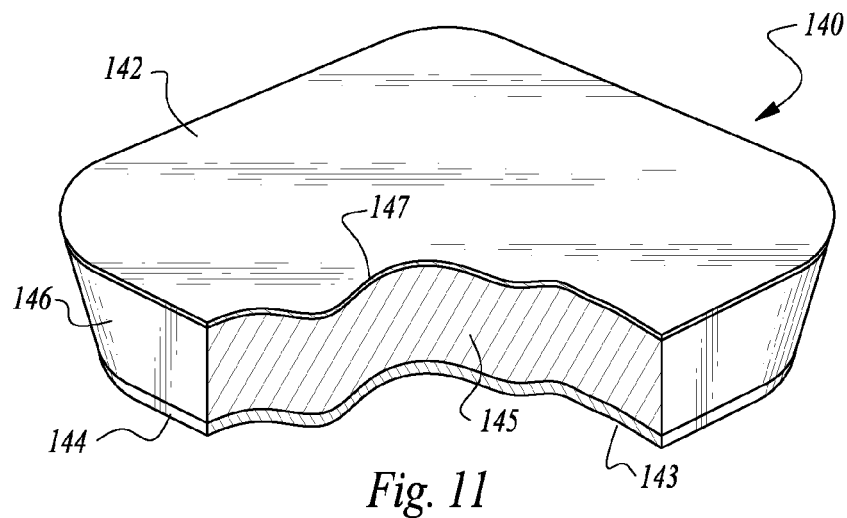
FIG. 11 is a perspective view of a terminal pad of the alternative lead carrier of this invention with a portion thereof cut away, illustrating how the terminal pad in this embodiment is formed of multiple materials including a lower layer, a body portion and an upper layer.
Figure 12:
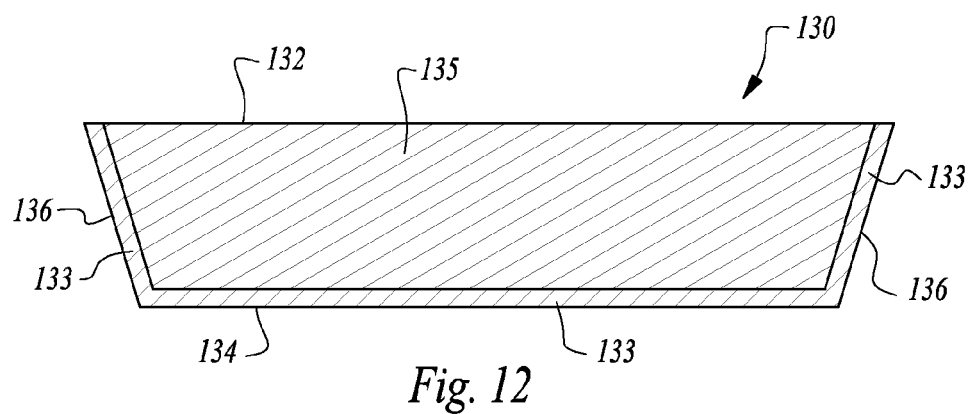
FIG. 12 is a full sectional view of a die attach pad according to the alternative lead carrier of this invention which is formed of multiple materials including a lower layer and a body portion.
Figure 13:
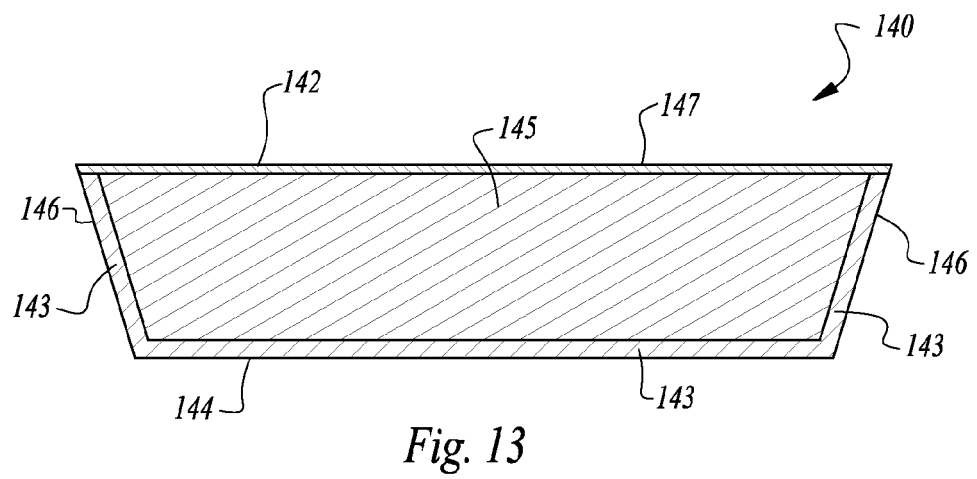
FIG. 13 is a full sectional view of that which is shown in FIG. 11, and illustrating how the lower layer also defines side edges of the terminal pad in this embodiment of the invention.

With particular reference to FIGS. 11-13, unique details of an alternative lead carrier 110 (FIGS. 21, 23 and 24) are described, according to this alternative embodiment. With this alternative lead carrier 110, pads are provided in the form of die attach pads 130 and terminal pads 140. These pads 130, 140 are uniquely in this embodiment formed of multiple materials. In particular, a first material is provided defining a lower layer 133, 143 and a second material is provided defining a body portion 135, 145. An optional third layer 147 is provided formed of a third material which can in some embodiments be the same as the first material.

In particular, and with reference to FIG. 11, a terminal pad 140 is provided which includes an upper side 142 opposite a lower side 144 and with an edge 146 extending between the upper side 142 and lower side 144. A lower layer 143 formed of the first material defines the lower side 144 and optionally also the edges 146. A body portion 145 defines interior portions of the terminal pad 140. An optional upper layer 147 is provided defining the upper side 142. Most preferably, the body portion 145 is at least five times greater in thickness than the lower layer 143. The upper layer 147 can be similar to a thickness of the lower layer 143. In some embodiments the upper layer 147 and lower layer 143 could be as little as one-hundredth the thickness of the body portion 145, or even less.

With particular reference to FIG. 12, a die attach pad 130 of this alternative lead carrier 110 is described. The die attach pad 130 is also formed of multiple materials but in this embodiment only is formed of two separate materials. In particular, the die attach pad 130 includes a top side 132 opposite a bottom side 134 and bounded by edges 136. A lower layer 133 is provided which is formed of a first material. A body portion 135 is provided which is formed of a second material. The lower layer 133 preferably defines the bottom side 134 and the edges 136 of the die attach pad 130. The body portion 135 defines interior portions of the die attach pad 130 and the top side 132 of the die attach pad 130.

While FIG. 12 is identified as depicting a die attach pad 130 and FIGS. 11 and 13 are depicted as identifying a terminal pad 140, it is conceivable that both the die attach pad 130 and terminal pad 140 could have a configuration similar to that depicted in FIGS. 11 and 13, with a lower layer below a body portion and with an upper layer above the body portion. Also, it is conceivable that the configuration depicted in FIG. 12 as associated with the die attach pad 130 could be provided for the terminal pad 140 as well. However, in a preferred embodiment the die attach pads 130 are formed with two separate materials as depicted in FIG. 12 and the terminal pads 140 are provided with three separate layers as depicted in FIGS. 11 and 13.

Materials forming the lower layer 143 are selected to exhibit a greater resistance to corrosion than the body portion 145 and to be more highly solderable than the body portion 145. Examples of suitable materials for forming this lower layer 143 include silver, gold, platinum, nickel, palladium, tin and alloys formed primarily of one or more of these metals. When the term alloys is used, it can be broadly interpreted to include amalgams and other mixtures of different elements without any particular specification of any degree of homogenous mixing thereof, or crystal formation thereof.

Materials from which the body portion can be formed can include copper, nickel, iron and alloys primarily of one or more of these metals. The body portion provides mechanical strength for the pads 130, 140 and adds a desired overall thickness. Because the body portion 145 defines a majority of the thickness of the pad 140, materials can be selected having a lower cost but which still exhibit a minimum necessary amount of electrical conductivity, but manufacturing cost can be minimized. One measure of such cost can be the rarity on Earth of such elements from which the body portion 145 and lower layer 143 are formed. The upper layer 147 is formed of a material which is selected to be highly compatible with thermosonic welding of gold wire or copper wire. Examples of suitable materials for forming this upper layer include gold, silver, platinum, palladium, aluminum, nickel and alloys primarily of these metals.

With particular reference to FIGS. 14-25, details of a series of steps in the manufacture of the alternative lead carrier 110 (FIGS. 21, 23 and 24) are described, according to a preferred embodiment. The figures are generally provided in a typical sequence for manufacturing of the alternative lead carrier 110 and resulting packages 112. Where beneficial, detail figures are included to depict finer features of the alternative lead carrier 110 and package 112.

Figure 14:
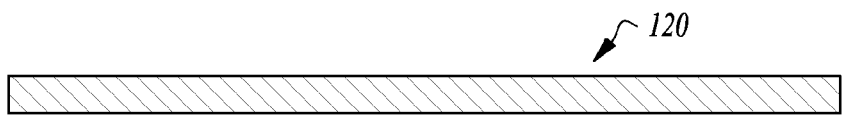
FIGS. 14-17 are full sectional sequential views of steps in forming the alternative lead carrier according to one embodiment of this invention.
Figure 15:
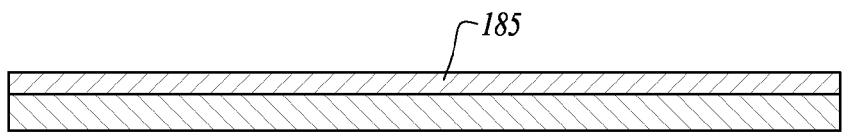

Initially, and as referenced in FIG. 14, a temporary support member 120 is supplied. This temporary support member 120 has a top surface which is preferably planar and spans a width between edges of the temporary support member 120. This temporary support member 120 is preferably formed of stainless steel. It importantly should be sufficiently flexible to facilitate peeling removal from other portions of the alternative lead carrier 110 (FIG. 21) after full formation of packages 112 (FIG. 24) upon the temporary support member 120. The material forming the temporary support member 120 also is selected to be able to withstand temperatures at which metal powder forming the body portion 135, 145 of the die attach pads 130 and terminal pads 140 can sinter together and decompose or otherwise remove any suspension medium for this material. The temporary support member 120 should either be formed of a material which is compatible with placement of temporary form material 180 thereon (FIG. 16) or compatible after some degree of etching or other surface treatment upon the top surface of the temporary support member 120. Stainless steel is one suitable material for the temporary support member 120.

Figure 16:
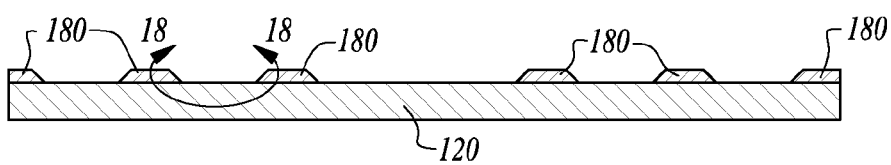

As a next step (FIG. 15) a layer of temporary form material 180 is applied to the upper surface of the temporary support member 120. Photo etch mask can be utilized or other techniques utilized to selectively remove portions of this initial layer 185 of photo etching material to leave the temporary form material 180 upon the temporary support member 120 (FIG. 16). As an alternative, the temporary form material could be printed onto the surface where desired. Positions for pads 130, 140 are provided between portions of the temporary form material 180, such as that depicted in detail in FIG. 18. The temporary form material 180 preferably has a contour which includes substantially planar top surfaces 182 transitioning down to the surface of the temporary support member 120 through lateral surfaces 184. These lateral surfaces 184 preferably taper so that the positions between the sections of temporary form material 180 are narrower adjacent the temporary support member 120 than adjacent the top surfaces 182 of the temporary form material 180.

Figure 17:
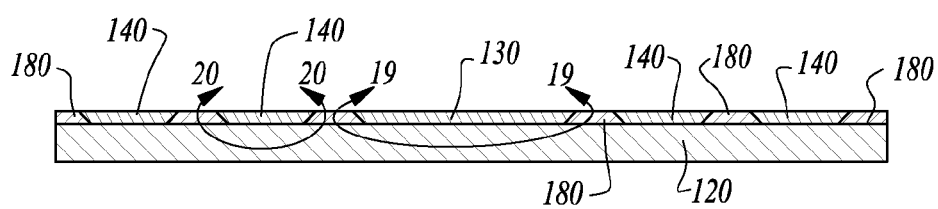
Figure 18:
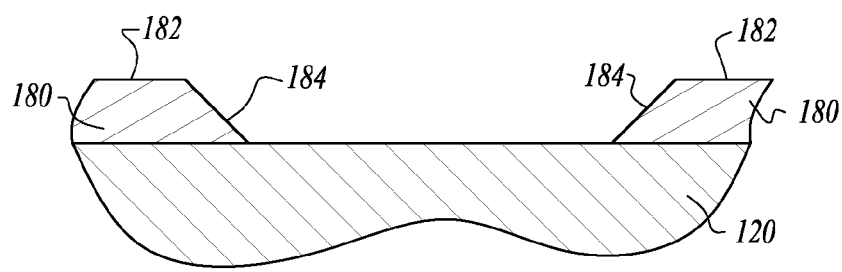
FIG. 18 is a detail of a portion of that which is shown in FIG. 16, taken along lines 18-18 of FIG. 16.
Figure 19:
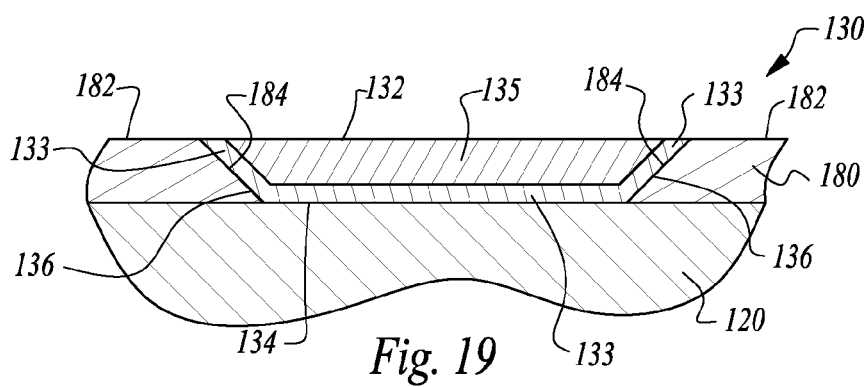
FIG. 19 is a detail of a portion of that which is shown in FIG. 17, taken along lines 19-19 of FIG. 17.

FIG. 17 depicts the positions for the pads 130, 140 between the temporary form material 180, after the pads 130, 140 have been formed therein. This formation includes two steps including a first step where the lower layer 133, 143 of the pads 130, 140 are placed (FIG. 19). This lower layer 133, 143 is positioned adjacent the temporary support member 120 and adjacent the lateral surfaces 184 of the temporary form material 180. This first step can be executed through electroplating so that a relatively thin amount of the first material from which the lower layer 133, 143 is formed, can be deposited. In a second step, the remaining void, at the position between the sections of temporary form material 180, is filled with the second material from which the body portion 135, 145 of the pads 130, 140 are formed.

This material forming the body portions 145 preferably includes a metal powder and a suspension medium together having a consistency of a paste which can flow into the remaining portions of the void between the temporary form material 180 and above the lower layer 133, 143. A silk-screening process would be one way to apply this paste of metal powder and suspension medium. Other print forming methodologies could also be utilized to place the body portion 135, 145 material upon the lower layer 133, 143. The lower layer 133, 143 could also be placed the same way as the body portion 135, 145 or by electroplating.

With particular reference to FIG. 20, an optional third layer can be provided for the terminal pads 140, and optionally also for the die attach pads 130. This upper layer 147 can be of a material similar to that from which the lower layer 133, 143 is formed, or can be a dissimilar material. This upper layer 147 can be formed by electroplating or in the same fashion as the body portions 135, 145.

As depicted in FIG. 21, a next step involves removal of the temporary form material 180. This removal can occur by heating to a temperature at which the temporary form material 180 volatilizes, melts, or otherwise disperses. This temperature also preferably is sufficient to cause the suspension medium associated with the material forming the body portion 135, 145 to disperse or decompose, and also to have remaining metal powder portions sintered together to form a solid unitary mass defining the body portion 135, 145.

This heating step can simultaneously remove the temporary form material 180 and effectively harden the material from which the body portions 135, 145 are formed. In another embodiment, the temperature is ramped in such a way that first the body portions 135, 145 begin to sinter and harden, and then the temporary form material 180 is caused to decompose/disperse, or a reverse sequence can take place. A detail of the remaining terminal pad 140 after removal of the temporary form material 180, is depicted in FIG. 22.

Finally, the lead carrier 110 is outfitted with the mounting of an integrated circuit chip 160 or other semiconductor upon the die attach pad 130, and with wire bonds 150 joining the integrated circuit chip 160 to the terminal pad 140. Mold compound 170 then embeds the pads 130, 140, wire bonds 150 and integrated circuit chip 160 all together. After this mold compound 170 has hardened, the temporary form material 180 can be peeled away. Because the temporary form material 180 had lateral surfaces 184 which are tapered, the mold compound 170 fills voids formed by the removal of the temporary form material 180, resulting in holding features 172 between adjacent pads 130, 140 which tend to hold the pads 130, 140 within the mold compound 170 and prevent damage of the resulting packages 112.

A plurality of packages 112 are typically provided in a single lead carrier 110 before and after removal of the temporary support member 120. In this way, before singulation into individual packages 112, each package site can be electrically tested. If defects are found, a user can optionally cut away and dispose of defective packages, or if too many defects exist, the singulation step can be avoided and the entire lead carrier can be recycled. Such testing lends itself to automation and after singulation, any defective package sites can be automatically removed with remaining high confidence that resulting accepted packages 112 will exhibit expected performance.

Figure 26:
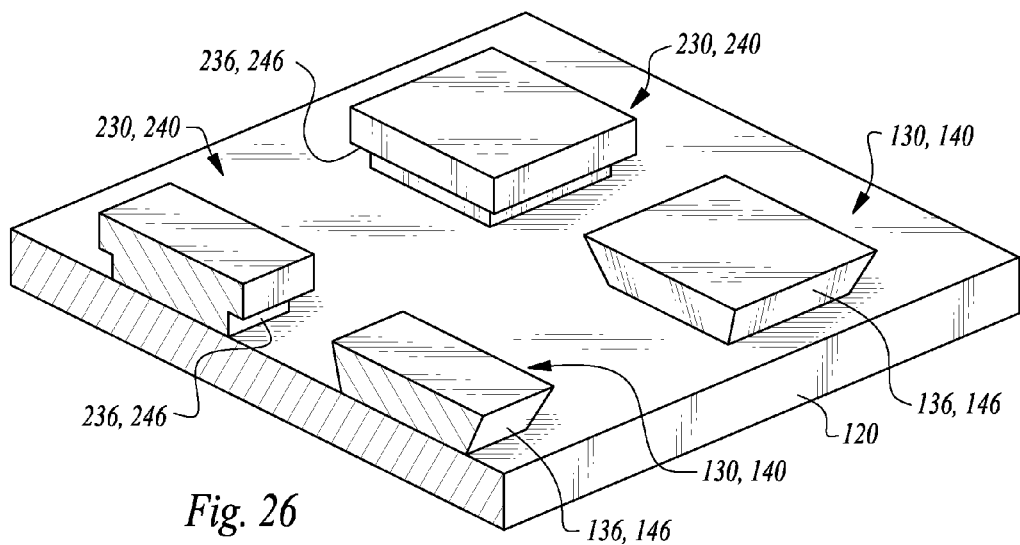
FIG. 26 is a perspective view partially cut away of a second alternative die attach pad and second alternative terminal pad configuration contrasted with the die attach pads and terminal pads of the other embodiments of this invention, and which facilitate interlocking of the pads with encapsulating mold compound that is later applied.

As depicted in FIG. 26, alternative die attach pads 230 and alternative terminal pads 240 are shown. These alternative pads 230, 240 exhibit a stepped edge 236, 246 as an alternative to the tapering side edges 136, 146 in the alternative lead carrier 110 of previous embodiments. Such a stepped form in these alternative pads 230, 240 can be formed by originally forming the temporary mold material 180 in two layers with slightly different size photo etch masks so that the two layers are photo etched with different dimensions resulting in this stepped character. If a lower layer of the temporary form material is wider than an upper layer of the temporary form material than when pads 230, 240 are formed against such dual layered temporary form material, such a stepped configuration will result. When the temporary form material is later removed, the stepped character of the pads 230, 240 is left open so that mold compound can flow into this gap and a secure holding feature is provided for holding the pads 230, 240 within the epoxy material of the package.

This disclosure is provided to reveal a preferred embodiment of the invention and a best mode for practicing the invention. Having thus described the invention in this way, it should be apparent that various different modifications can be made to the preferred embodiment without departing from the scope and spirit of this invention disclosure. When structures are identified as a means to perform a function, the identification is intended to include all structures which can perform the function specified. When structures of this invention are identified as being coupled together, such language should be interpreted broadly to include the structures being coupled directly together or coupled together through intervening structures. Such coupling could be permanent or temporary and either in a rigid fashion or in a fashion which allows pivoting, sliding or other relative motion while still providing some form of attachment, unless specifically restricted.

What is claimed is:

1. A lead carrier for manufacture of semiconductor packages, comprising in combination:
   at least one die attach pad formed of electrically conductive material;
   said die attach pad having a top side opposite a bottom side with edges between said top side and said bottom side;
   at least one terminal pad formed of electrically conductive material and spaced from said die attach pad;
   said terminal pad having an upper side opposite a lower side, with edges between said upper side and said lower side;
   at least one of said die attach pad and said plurality of terminal pads being a multi-material pad formed of at least two different materials including a first material in a lower layer and a second material in a body portion above and adjacent said lower layer;
   wherein said body portion of said at least one multi-material pad is formed of a sintered electrically conductive material;
   wherein a plurality of package sites, each with at least one of said die attach pads and at least one of said terminal pads are located upon a common flexible stainless steel support member having a melting point higher than a sintering temperature of said electrically conductive material forming said body portion of said at least one multi-material pad; and
   wherein said pads are electrically isolated from each other, other than through said support member.

2. The carrier of claim 1 wherein said first material in said lower layer is more resistant to corrosion than said second material in said body portion.

3. The carrier of claim 1 wherein said first material in said lower layer is more solderable than said second material in said body portion.

4. The carrier of claim 1 wherein said lower layer is up to one-fifth of a thickness of said body portion.

5. The carrier of claim 1 wherein said first material forming said lower layer is more rare than said second material forming said body portion.

6. The carrier of claim 1 wherein said lower layer is located both below said body portion and adjacent to lateral sides of said body portion with said lower layer defining said edges of said terminal pad and said edges of said die attach pad.

7. The carrier of claim 1 wherein said first material forming said lower layer is taken from the group of materials including silver, gold, platinum, nickel, palladium, tin and alloys which are formed of a majority of one or more of silver, gold, platinum, nickel, palladium and tin.

8. The carrier of claim 7 wherein said second material forming said body layer is distinct from said first material forming said lower layer and said second material taken from the group of materials including copper, nickel, iron and alloys which are a majority of one or more of copper, nickel and iron.

9. The carrier of claim 1 wherein at least one of said multi-material pads including an upper layer above and adjacent said body portion, said upper layer formed of a material which is compatible with thermosonic welding of gold wire or copper wire thereto.

10. The carrier of claim 1 wherein said lead carrier includes a plurality of multi-material pads with at least one of said terminal pads being a multi-material pad and at least one of said die attach pads being a multi-material pad.

11. The carrier of claim 10 wherein said multi-material terminal pad includes an upper layer above and adjacent said body portion, said upper layer formed of a material compatible with thermosonic welding of gold wire or copper wire thereto.

12. The carrier of claim 11 wherein said multi-material die attach pad includes an upper layer above and adjacent said body portion, said upper layer formed of a material compatible with thermosonic welding of gold wire or copper wire thereto.

13. The carrier of claim 1 wherein said at least one multi-material pad has a contoured edge which is at least partially contoured such that said contoured edge can hold said pad to a substantially electrically non-conductive material later applied to the lead carrier to at least partially encapsulate said at least one multi-material pad.

14. The carrier of claim 13 wherein said contoured edge has an upper extent opposite a lower extent, at least a first portion of said edge spaced from said lower extent defining a lateral pad width greater than a second portion of said edge closer to said lower extent than said first portion, such that said first portion overhangs said second portion.

15. The carrier of claim 14 wherein said edge exhibits a taper with portions of said edge most distant from said lower extent overhanging portions of said edge closer to said lower extent.

16. The carrier of claim 1 wherein said bottom side of said die attach pad and said lower sides of said terminal pads are located within a common plane.

* * * * *